United States Patent [19]

Inohana et al.

[11] Patent Number: 5,184,086
[45] Date of Patent: Feb. 2, 1993

[54] DIFFERENTIAL AMPLIFIER

[75] Inventors: Haruyuki Inohana; Shintaro Gomi, both of Saitama, Japan

[73] Assignee: Pioneer Electronic Corporation, Tokyo, Japan

[21] Appl. No.: 789,888

[22] Filed: Nov. 12, 1991

[30] Foreign Application Priority Data

Jun. 17, 1991 [JP] Japan ................................. 3-144885

[51] Int. Cl.$^5$ ............................................. H03F 3/45
[52] U.S. Cl. ..................................... 330/252; 330/257
[58] Field of Search ..................... 330/252, 257, 149

[56] References Cited

U.S. PATENT DOCUMENTS 4,081,758  3/1978  Steckler .
4,774,475  9/1988  LaVoie .
4,820,997  4/1989  Sano et al. ......................... 330/252

FOREIGN PATENT DOCUMENTS 0313189  4/1989  European Pat. Off. .
3138078  5/1982  Fed. Rep. of Germany .
4001573  7/1991  Fed. Rep. of Germany .
1045349  9/1983  U.S.S.R. .
1314441  5/1987  U.S.S.R. .

OTHER PUBLICATIONS

Japanese Abstract No. 62-120109 E-554, Nov. 7, 1987, vol. 11, No. 341.
Japanese Abstract No. 2-288504 A.E.-1033, Feb. 14, 1991, vol. 15, No. 62.
Japanese Abstracts No. 62-1000009 A. E-546, Oct. 6, 1987, vol. 11, No. 06.

*Primary Examiner*—James B. Mullins
*Attorney, Agent, or Firm*—Sughrue, Mion, Zinn, Macpeak & Seas

[57] ABSTRACT

A differential amplifier comprises: first and second transistors the emitters of which are connected to each other through a resistance element; a third transistor to the emitter of which a current equal to the collector current of the first transistor is applied; and a fourth transistor to the emitter of which a current equal to the collector current of the second transistor is applied. Signals provided at the emitters of the third and fourth transistors, after being level-shifted, are supplied to the bases of the second and first transistors, respectively. Thereby, a differential amplifier which is linear in transfer characteristic and large in input dynamic range is obtained.

2 Claims, 2 Drawing Sheets

DIFFERENTIAL AMPLIFIER

BACKGROUND OF THE INVENTION

This invention relates to a differential amplifier.

A differential amplifier, as shown in FIG. 4, improved in non-linear transfer characteristic has been proposed in Japanese Unexamined Patent Application No. 224411/1990. As shown in FIG. 4, the emitters of NPN transistors 1 and 2 are connected to each other through a resistor 7, and connected to current sources 13 and 14, respectively, which are adapted to supply bias currents to the transistors. The collector current I2 of the transistor 1 is applied to the emitter of a transistor 3, while the collector current I1 of the transistor 2 is applied to the emitter of a transistor 4. The base of the transistor 1 is connected to the emitter of the transistor 4, while the base of the transistor 2 is connected to the emitter of the transistor 3. A signal source 11 provides an input signal Vi between the bases of the transistors 3 and 4. A voltage source 9 applies a bias voltage Vr to the bases of the transistors 3 and 4.

Another voltage source 10 supplies a supply voltage Vcc directly to the collector of the transistor 3, and through a load resistor 8 to the collector of the transistor 4. The differential amplifier thus organized provides an output signal Vout at the connecting point of the load resistor 8 and the collector of the transistor 4. The output signal is supplied to an output terminal 12.

In the differential amplifier, the collector currents I1 and I2 change in response to the input signal Vi. When the input signal Vi increases in a positive direction with the base of the transistor 3 as positive side, the collector current I1 increases whereas the collector current I2 decreases. Assuming that the base currents of the transistors 1 and 2 can be disregarded because they are much smaller than the collector currents I1 and I2, then in the case when the input signal Vi is 0 V, $I1=I2=I0$ where I0 is the output current of each of the current sources 13 and 14.

The input signal Vi can be expressed by the following Equation (1):

$$Vi = Vbe3 + Vbe2 + (I1-I0) \cdot R7 - (Vbe1 + Vbe4) \quad (1)$$

where R7 is the resistance of the resistor 7, and Vbe1, Vbe2, Vbe3 and Vbe4 are the base-emitter voltages of the transistors 1, 2, 3 and 4, respectively.

The relation between the base-emitter voltage Vbe1 and the current I2 can be represented by the following Equation (2)

$$I2 = Is \cdot \{\exp(Vbe1/Vt) - 1\} \quad (2)$$

where Is is the saturation current of the transistor, and Vt is $k \cdot T/q$ in which k is Boltzmann's constant, T is the absolution temperature, and q is the electron charge.

By solving Equation (2) for Vbe1, the following Equation (3) can be obtained:

$$Vbe1 = Vt \cdot \ln(I2/Is + 1) \quad (3)$$

In the case where the transistors 1 and 2 are equal in characteristics, then the base-emitter voltage Vbe2 can be represented by the following Equation (4):

$$Vbe2 = Vt \cdot \ln(I1/Is + 1) \quad (4)$$

In the case where the transistors 3 and 4 have the same characteristic as the transistors 1 and 2 and the base currents of the transistors 3 and 4 are disregarded, the base-emitter voltages Vbe3 and Vbe4 of the transistors 3 and 4 are as follows:

$$Vbe3 = Vt \cdot \ln(I2/Is + 1) \quad (5)$$

$$Vbe4 = Vt \cdot \ln(I1/Is + 1) \quad (6)$$

Insertion of Equations (3), (4), (5) and (6) in Equation (1) results in the following Equation (7):

$$\begin{aligned} Vi &= Vt \cdot \ln(I2/Is + 1) + Vt \cdot \ln(I1/Is + 1) + \\ &\quad (I1 - I0)R7 - \{Vt \ln \cdot (I2/Is + 1) + \\ &\quad Vt \cdot \ln(I1/Is + 1)\} \\ &= (I1 - I0)R7 \end{aligned} \quad (7)$$

By solving Equation (7) for I1, the following Equation (8) is obtained:

$$I1 = I0 + Vi/R7 \quad (8)$$

Because $I1 + I2 = 2 \cdot I0$, therefore, the following Equation (9) is obtained:

$$I2 = I0 - Vi/R7 \quad (9)$$

When the resistance of the resistor 8 is RL, the output signal Vout can be expressed as follows:

$$\begin{aligned} Vout &= Vcc - I1 \cdot RL \\ &= Vcc - (I0 + Vi/R7) \cdot RL \\ &= Vcc - I0 \cdot RL - (RL/R7) \cdot Vi \end{aligned} \quad (10)$$

As is seen from Equation (10), Vout is obtained by amplifying Vi with a gain of RL/R7.

As is apparent from the above description, in the circuit shown in FIG. 4, the distortion component (which is the non-linearity attributing to the relation between the collector current and the base-emitter voltage of a transistor) is eliminated on the basis of the relation of Vi and Vout. That is, the differential amplifier is excellent in linearity.

On the other hand, in the above-described differential amplifier, the collector-base voltage Vcb1 of the transistor 1 is expressed as follow:

$$\begin{aligned} Vcb1 &= Vr + Vi - Vbe3 - (Vr - Vbe4) \\ &= Vi - Vbe3 + Vbe4 \end{aligned} \quad (11)$$

Similarly, the collector-base voltage Vcb2 of the transistor 2 can be represented by the following Equation (12):

$$Vcb2 = Vbe3 - Vbe4 - Vi \quad (12)$$

In the case where the input signal is large in amplitude, the base-emitter voltages Vbe3 and Vbe4 can be regarded as substantially equal to each other, and therefore Equations (11) and (12) can be approximated as follows:

$$Vcb1 \approx Vi \quad (13)$$

$$Vcb2 \approx -Vi \quad (14)$$

As is seen from Equations (13) and (14), the collector-base voltages of the transistor 1 and 2 become negative in accordance with the input signal Vi, so that the transistors Operate in the saturation region. When a transistor operates in the active region, the current amplification factor hfe is greatly decreased, and the base current is accordingly increased. That is, in this case, unlike the above-described case, the base current cannot be disregarded. In Equation (7), the base-emitter voltages Vbe corresponding to the non-linear components are not included because $Vbe1 = Vbe3$ and $Vbe2 = Vbe4$ are satisfied. However, these relations are not satisfied in the case where the transistors 3 and 4 operate in the active region whereas the transistors 1 and 2 operate in the saturation region. Hence, when the input signal is large in amplitude, then Equation (7) is no longer established. Thus, the conventional differential amplifier suffers from the difficulty that it is small in input dynamic range.

SUMMARY OF THE INVENTION

Accordingly, an object of this invention is to provide a differential amplifier which is linear in transfer characteristic and large in input dynamic range.

A differential amplifier, according to the invention, comprises: a resistance element; first and second transistors the emitters of which are connected to each other through the resistance element; a third transistor to the emitter of which a current equal to the collector current of the first transistor is supplied; a fourth transistor to the emitter of which a current equal to the collector current of the second transistor is supplied; first level shift means for level-shifting a signal as much as a predetermined value which is provided at the emitter of the third transistor and applying the signal thus level-shifted to the base of the second transistor; and second level shift means for level-shifting a signal as much as a predetermined value which is provided at the emitter of the fourth transistor, and applying the signal thus level-shifted to the base of the first transistor, the bases of the third and fourth transistors being employed as input terminals, at least one of the collectors of the first and second transistors, or at least one of the collectors of the third and fourth transistors being employed as an output terminal.

In the differential amplifier of the invention, the collector-base voltages of the first and second transistors are made higher than the predetermined values by the level shift means. Therefore, even when the input signal is large in amplitude, the operating points of the first and second transistors will not come in the saturation region, so that the distortion is prevented from being increased.

DESCRIPTION OF THE PREFERRED EMBODIMENTS

Embodiments of this invention will be described with reference to FIGS. 1 through 3.

Figure 1:
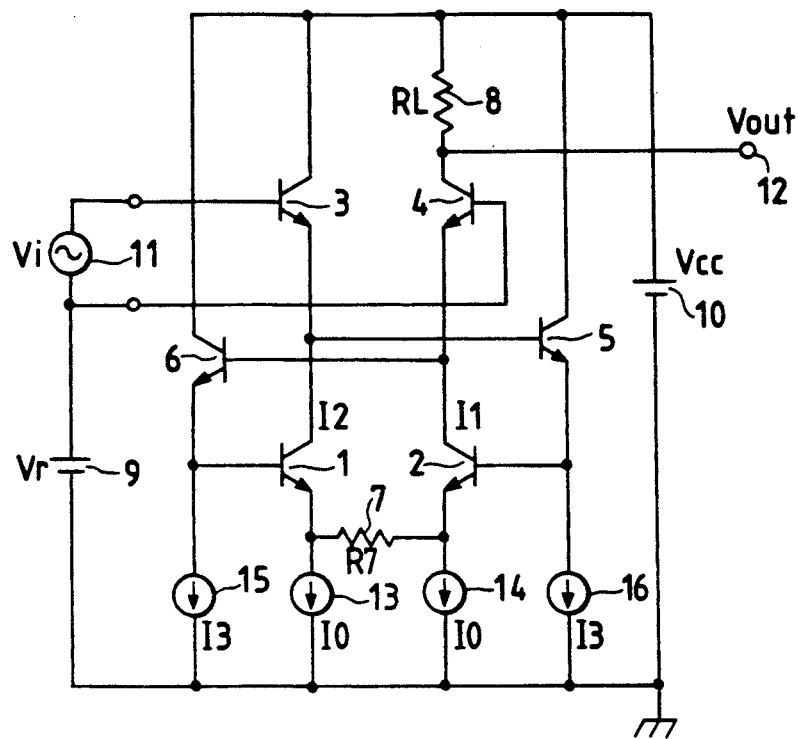
FIG. 1 is a circuit diagram showing a first embodiment of this invention.
Figure 4:
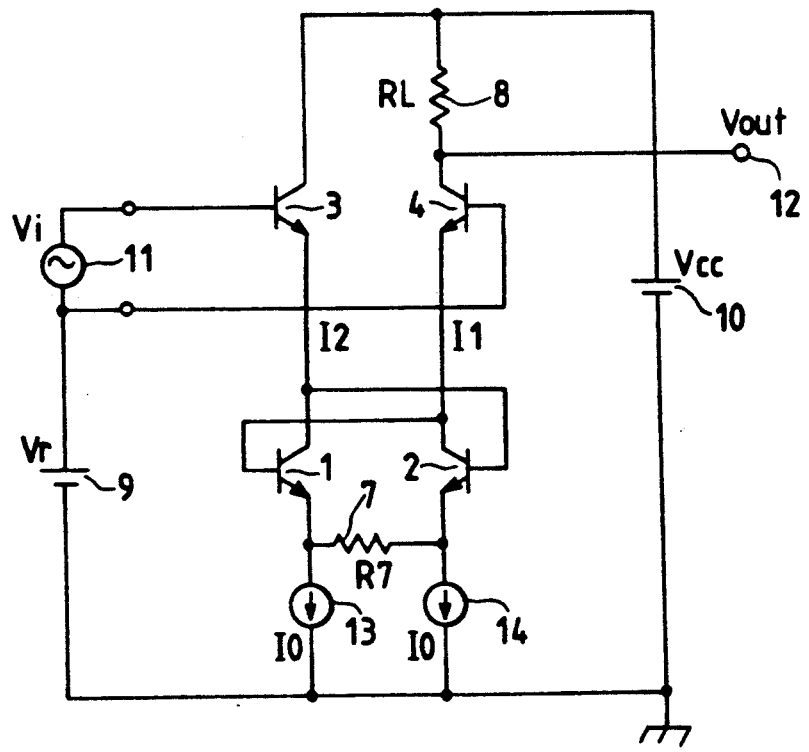
FIG. 4 is a circuit diagram showing a conventional differential amplifier.

A first embodiment of the invention is as shown in FIG. 1. In FIG. 1, transistors 1, 2, 3 and 4, resistors 7 and 8, current sources 13 and 14, a signal source 11, voltages sources 9 and 10, and an output terminal 12 are connected substantially in the same manner as in FIG. 4. In addition, the emitter of the transistor 3 is connected the base of a transistor 5, and the emitter of the transistor 4 is connected to the base of a transistor 6. The collectors of the transistors 5 and 6 are connected to the positive power line (or the positive terminal of the power source 10. The emitter of the transistor 5 is connected to the base of the transistor 2 and to one terminal of a current source 16, the other terminal of which is connected to the ground line (or the negative terminal of the power source 10). The emitter of the transistor 6 is connected to the base of the transistor 1 and to one terminal of a current source 15, the other terminal of which is connected to the ground line.

In the differential amplifier thus arranged, the input signal can be represented by the following Equation (15)

$$Vi = Vbe3 + Vbe5 + Vbe2 + (I1 - I0) \cdot R7 \\ - (Vbe1 + Vbe6 + Vbe4) \quad (15)$$

In the case where the transistors 5 and 6 are equal in characteristic to each other, and the current sources 15 and 16 are equal in current value to each other, the following Equation (16) is established:

$$Vbe5 = Vbe6 \quad (16)$$

If the base currents of the transistors 3, 4, 5 and 6 are disregarded, then the collector currents of the transistors 1 and 3 are equal to each other, and the collector currents of the transistors 2 and 4 are also equal to each other. Hence, the following Equations (7) and (8) are established:

$$Vbe1 = Vbe3 \quad (17)$$

$$Vbe2 = Vbe4 \quad (18)$$

By inserting Equations (16), (17) and (18) into the Equation (15), the following Equation (19) can be obtained:

$$Vi = (I1 - I0) R7 \quad (19)$$

This Equation (19) is equal to Equation (7). Hence, the output Vout is provided at the output terminal from which the distortion due to the non-linearity of the base-emitter voltages Vbe of the transistors has been eliminated.

The collector-base voltage Vcb1 and Vcb2 of the transistors 1 and 2 can be represented by the following Equations (20) and (21):

$$Vcb1 = Vr + Vi - Vbe3 - (Vr - Vbe4 - Vbe6) \\ = Vi - Vbe3 + Vbe4 + Vbe6 \quad (20)$$

$$Vcb2 = Vr - Vbe4 - (Vr + Vi - Vbe3 - Vbe5) \\ = -Vi - Vbe4 + Vbe3 + Vbe5 \quad (21)$$

In the case where the input signa Vi is large in amplitude, Vbe3 and Vbe4 can be regarded as substantially equal to each other. Hence, the following Equations (22) and (23) are established:

$$Vcb1 \approx Vi + Vbe6 \quad (22)$$

$$Vcb2 \approx -Vi + Vbe5 \quad (23)$$

As is seen from Equations (22) and (23), even when the input signal Vi becomes large in amplitude, the collector-base voltages Vcb1 and Vcb2 will not become negative until the peak value of the input signal becomes larger than the base-emitter voltages Vbe5 and Vbe6. Accordingly, the transistors 1 and 2 are not saturated, and the distortion is minimized even when the input signal is large in amplitude.

The transistors 5 and 6 and the current sources 15 and 16 form level shift means. The current value I3 of each of the current sources 15 and 16 may be smaller than that I0 of the current sources 13 and 14. In this case, the error from the theoretical value can be reduced which is due to the disregarding of the base currents of the transistors.

Figure 2:
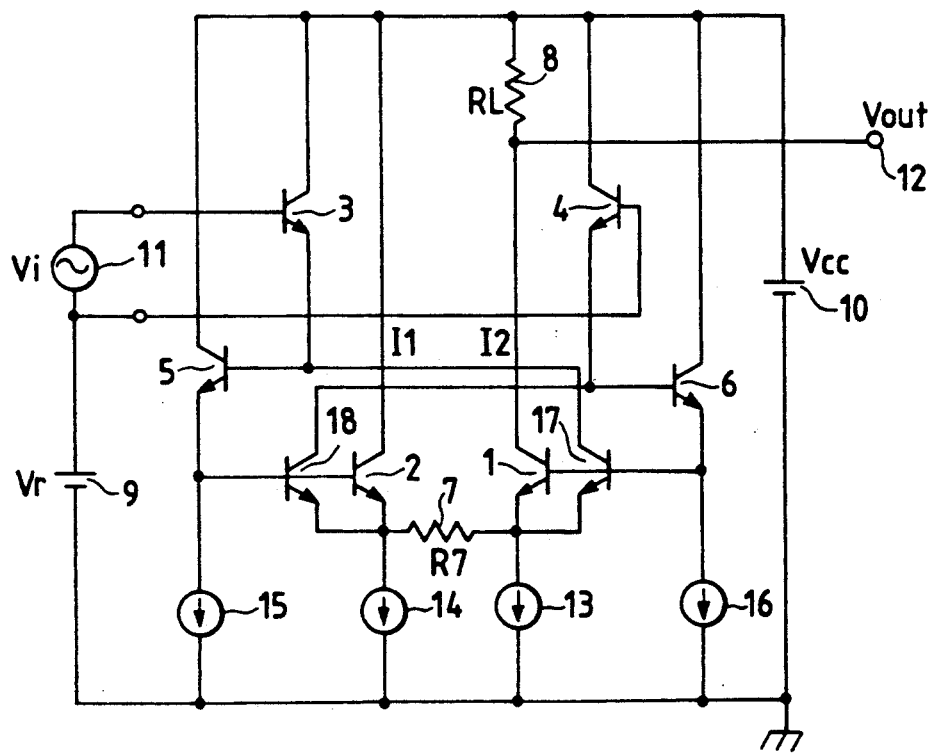
FIG. 2 is a circuit diagram showing a second embodiment of the invention.

FIG. 2 shows a second embodiment of this invention. The second embodiment is different from the above-described first embodiment in the following points: Transistors 17 and 18 are added in such a manner that their bases and emitters are connected to the bases and emitters of the transistors 1 and 2, respectively. The collector of the transistor 1 is connected through the resistor 8 to the power line (or the positive terminal of the power source 1), and the collector of the transistor 4 is connected directly to the power line. The collector of the transistor 17 is connected to the connecting point of the emitter of the transistor 3 and the base of the transistor 5. The transistor 17 together with the transistor 1 forms a current mirror circuit, and the collector current of the transistor 17 is equal to that of the transistor 1. The collector of the transistor 18 is connected to the connecting point of the emitter of the transistor 4 and the base of the transistor 6. The transistor 18 together with the transistor 2 forms a current mirror circuit, and the collector current of the transistor 18 is equal to that of the transistor 2. The signal provided at the connecting point of the transistor 1 and the resistor 8 is applied to the output terminal Vout.

In the case where, in the differential amplifier thus arranged, the base currents of the transistors are disregarded, then the collector currents of the transistors 1 and 3 are equal to each other, and similarly the collector currents of the transistors 2 and 4 are equal to each other. Hence, the relations between the base-emitter voltages Vbe1 and Vbe3 and between the base-emitter voltages Vbe2 and Vbe4 can be represented by the following Equations (24) and (25), respectively:

$$Vbe1 = Vbe3 \quad (24)$$

$$Vbe2 = Vbe4 \quad (25)$$

Equations (24) and (25) are equal to Equations (17) and (18). Hence, similarly as in the first embodiment shown in FIG. 1, the base-emitter voltage corresponding to the non-linear component is eliminated.

Figure 3:
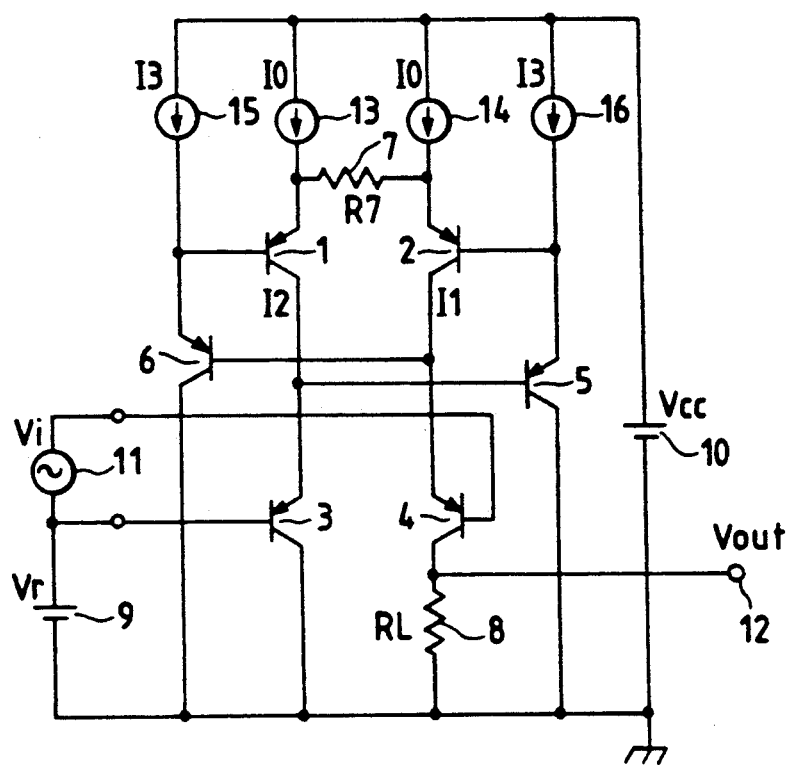
FIG. 3 is a circuit diagram showing a third embodiment of the invention.

FIG. 3 is a circuit diagram showing a third embodiment of this invention. The third embodiment is equal in arrangement to the first embodiment (FIG. 1) except that, instead of the NPN transistors, PNP transistors are employed. The differential amplifier thus arranged is equal in operation to the differential amplifier shown in FIG. 1, thus providing the same effects.

The differential amplifier shown in FIG. 2 may be modified by using PNP transistors instead of the NPN transistors. The differential amplifier thus modified operates in the same manner, thus providing the same effects.

As was described above, in the differential amplifier of the invention, the non-linearity of the base-emitter voltages Vbe of the transistors corresponding to the lo distortion components is eliminated to reduce the distortion factor, and with the level shift means, the transistors forming the differential pair are prevented from being saturated, whereby the input dynamic range is increased. With emitter followers as the level shift means, in the elimination of the non-linearity Of Vbe, the base currents forming error components can be reduced; that is, the error components can be decreased as much, which contributes to a further reduction of the distortion factor.

What is claimed is:

1. A differential amplifier comprising:
   a resistance element;
   first and second transistors, emitters of which are connected to each other through said resistance element;
   a third transistor, the emitter of which is connected to the collector of said first transistor;
   a fourth transistor, the emitter of which is connected to the collector of said second transistor;
   first level shift means for level-shifting a signal as much as a predetermined value which is provided at emitter of said third transistor, and applying said signal thus level-shifted to the base of said second transistor; and
   second level shift means for level-shifting a signal as much as a predetermined value which is provided at the emitter of said fourth transistor, and applying said signal thus level-shifted to the base of said second transistor,
   a fifth transistor, an emitter and a base of which are connected to the emitter and base of said second transistor so as to form a current mirror circuit; and
   a sixth transistor, an emitter and a base of which are connected to the emitter and base of said first transistor so as to form a current mirror circuit;
   wherein based of said third and fourth transistors are employed as input terminals, and wherein at least one of the collectors of said fifth and sixth transistors are employed as an output terminal.

2. A differential amplifier comprising:
   first transistor, emitter of which is connected to first current source, and collector of which is connected to voltage source;
   first current mirror transistor, an emitter and a base of which are connected to the emitter and base of said first transistor so as to form a current mirror circuit;
   second transistor, emitter of which is connected to second current source, and collector of which is connected to the voltage source;
   second current mirror transistor, an emitter and a base of which are connected to the emitter and base of said second transistor so as to form a current mirror circuit;

first resistance element connected between the emitters of said first and second transistors;

third transistor, collector of which is connected to the voltage source, and emitter of which is connected to collector of said first current mirror transistor;

fourth transistor, collector of which is connected to the voltage source, and emitter of which is connected to collector of said second current mirror transistor;

fifth transistor, collector of which is connected to the voltage source, emitter of which is connected to third current source and bases of said second transistor and second current mirror transistor, and base of which is connected to the emitter of said third transistor; and sixth transistor, collector of which is connected to the voltage source, emitter of which is connected to forth current source and base of said first transistor and first transistor current mirror transistor, and base of which is connected to the emitter of said fourth transistor;

wherein bases of said third and fourth transistors are employed as input terminals, and wherein one of the collectors of said first and second transistors are connected to the voltage source through a load resistance element so as to be employed as an output terminal.

* * * * *